US 6,677,553 B2

(12) United States Patent
Matsumoto et al.

(10) Patent No.: US 6,677,553 B2
(45) Date of Patent: Jan. 13, 2004

(54) LASER PROCESSING APPARATUS

(75) Inventors: Takashi Matsumoto, Hadano (JP);
Shinichi Kazui, Hadano (JP);
Masayuki Kawaharata, Yokohama
(JP); Madoka Tanouchi, Hadano (JP);
Masatake Muranaga, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/285,516

(22) Filed: Nov. 1, 2002

(65) Prior Publication Data

US 2003/0052104 A1 Mar. 20, 2003

Related U.S. Application Data

(63) Continuation of application No. 09/631,949, filed on Aug. 3, 2000, now Pat. No. 6,498,319.

(30) Foreign Application Priority Data

Aug. 6, 1999 (JP) .......................................... 11-223465

(51) Int. Cl.⁷ ...................... B23K 29/08; B23K 26/03; B23K 26/06; B23K 26/14
(52) U.S. Cl. ............................ 219/121.81; 219/121.75; 219/121.83; 219/121.84
(58) Field of Search .................... 219/121.83, 121.84, 219/121.73, 121.75, 121.67, 121.72, 121.81

(56) References Cited

U.S. PATENT DOCUMENTS

| 3,770,529 A | * 11/1973 | Anderson |
| 5,589,090 A | * 12/1996 | Song ..................... 219/121.67 |
| 5,880,011 A | 3/1999 | Zablotny et al. |
| 5,916,460 A | 6/1999 | Imoto et al. |
| 6,031,200 A | * 2/2000 | Whitehouse ........... 219/121.67 |

FOREIGN PATENT DOCUMENTS

| DE | 3923829 A1 | * 1/1991 | |
| JP | 61-74794 A | * 4/1986 | ............ 219/121.75 |
| JP | 61-244008 | 10/1986 | |
| JP | 62-93095 | 4/1987 | |
| JP | 62-93095 A | * 4/1987 | ............ 219/121.75 |
| JP | 5-190374 | 7/1993 | |
| JP | 6-673 A | * 1/1994 | |
| JP | 6-155063 A | * 6/1994 | |
| JP | 9-1369 | 1/1997 | |
| JP | 9-104018 | 4/1997 | |
| JP | 10-263865 | 10/1998 | |
| JP | 10-335170 | 12/1998 | |
| JP | 11-54885 | 2/1999 | |
| JP | 11-90894 | 4/1999 | |
| JP | 11-123573 A | * 5/1999 | |
| JP | 11-129083 A | * 5/1999 | |

* cited by examiner

Primary Examiner—Geoffrey S. Evans
(74) Attorney, Agent, or Firm—Antonelli, Terry, Stout & Kraus, LLP

(57) ABSTRACT

A laser processing apparatus includes a stage for mounting a workpiece, which moves the workpiece along two axes which are in parallel with the workpiece, the two axes being perpendicular to one other; a laser optical unit including a light source uniting laser light for irradiating the workpiece mounted on the stage with laser light, a stage controller for controlling the movement of the stage in each direction of the two axes, a collecting lens for collecting laser light and irradiating the workpiece with the laser light; a casing for placing the collecting lens on an optical path of the laser light, and a driving unit for moving the casing in a direction parallel to the optical path of the laser light. The driving unit moves the casing and focuses a focal point of the collecting lens on the workpiece.

18 Claims, 13 Drawing Sheets

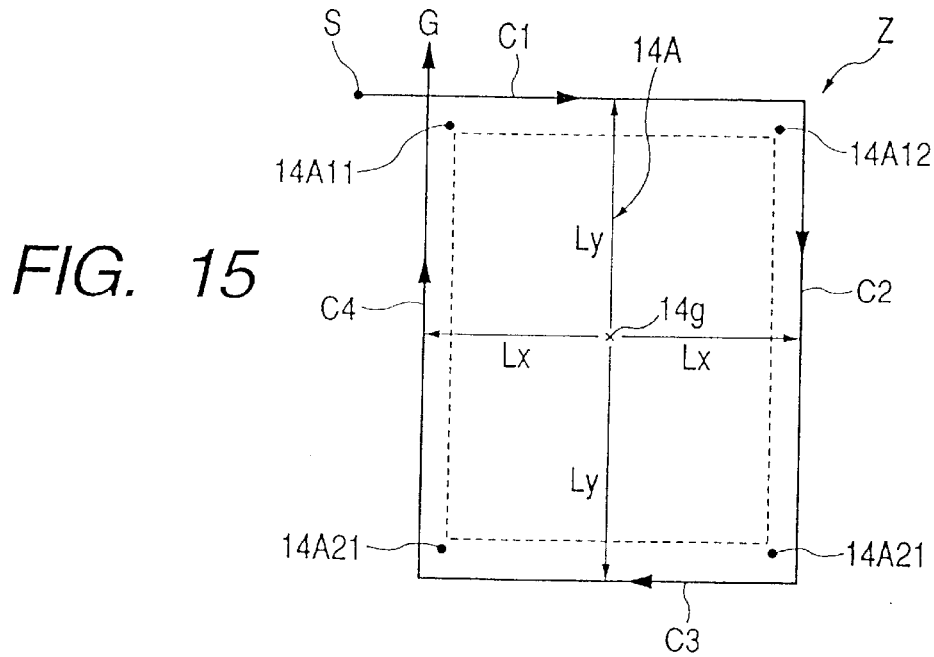
FIG. 15
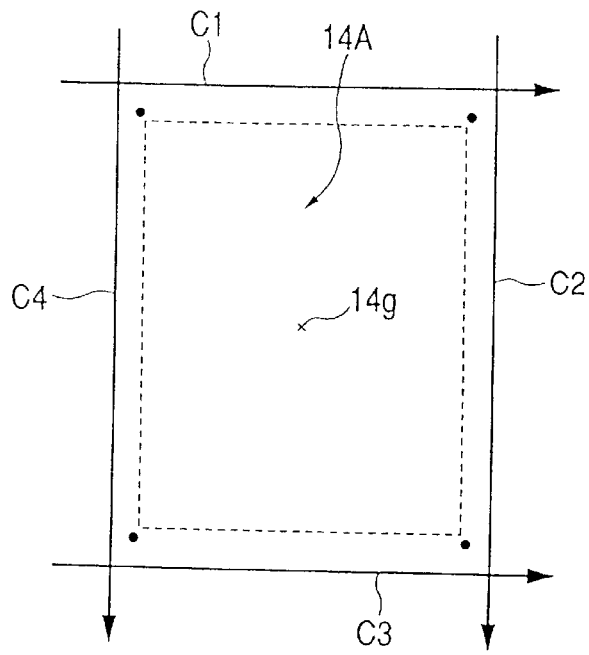
FIG. 16
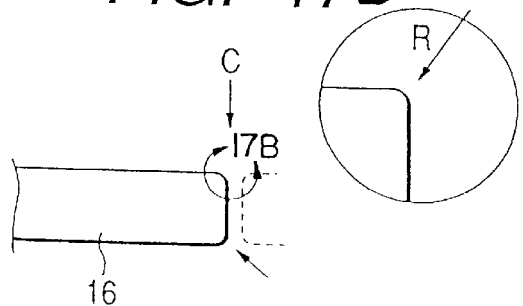
FIG. 17A
FIG. 17B

LASER PROCESSING APPARATUS

CROSS REFERENCE TO RELATED APPLICATION

This is a continuation of U.S. application Ser. No. 09/631,949, filed Aug. 3, 2000, now U.S. Pat. No. 6,498,319 B1, the subject matter of which is incorporated by reference herein.

BACKGROUND OF THE INVENTION

The present invention relates to a method and an apparatus for manufacturing electronic circuit boards, and particularly to a multi-layer board manufacturing method and a multi-layer board manufacturing apparatus suitable for manufacturing multi-layer ceramic boards.

Recently, the mounting configuration of electronic circuit components such as ICs and LSIs, which are used not only in information equipment but also in household appliances and automobile parts, has become denser. With the increasing density of mounting configuration, there has been a stronger tendency to increase the density and layers of electronic circuit boards for mounting electronic circuit components. Ceramic boards, which are laminated with green sheets and sintered, are becoming dominant as a material for electronic circuit boards.

When a ceramic board is manufactured, through holes are formed in green sheets, and circuits are formed by printing. After laminated and bonded by pressing, the green sheets are cut to board size, and then sintered to form a ceramic board. In methods for manufacturing ceramic boards, cutting is performed by methods using cutter blades or stamping methods using dies, as disclosed, for example, in Japanese Patent Laid-Open No. Hei 5-190374, Japanese Patent Laid-Open No. Hei 9-104018, Japanese Patent Laid-Open No. Hei 10-335170, and Japanese Patent Laid-Open No. Hei 11-90894. The methods mentioned above are for mechanical processing.

On the other hand, as disclosed in, for example, Japanese Patent Laid-Open No. Hei 9-1369, there is a known method in which a board is laminated with green sheets and sintered, and then the sintered multi-layer board is cleaved by using a laser. A laser cleavage cut is performed by irradiating the surface of the multi-layer board with laser light with a large beam diameter at a position off the focal point, so that thermal stress occurring in the heated part due to the laser light causes the multi-layer board to be cleaved.

SUMMARY OF THE INVENTION

In methods of cutting a multi-layer ceramic board by mechanical processing, the number of electronic circuit boards manufactured from a green sheet is limited, and therefore it presents a problem of low yields. In order to increase the yields, electronic circuit boards with a plurality of sizes may be arranged on a large green sheet in such a way as to eliminate waste. With mechanical processing methods, it is impossible to cut the plurality of circuit boards arranged close to each other on the green sheet. The reasons for this include a large cut margin resulting from a mechanical processing method and the incapability of mechanical processing methods to perform two-dimensional cutting. Two-dimensional cutting will be described later in detail. One-dimensional cutting means that a sheet is first cut sequentially only in one direction, and then the cut long, narrow sheet is further cut in a direction perpendicular to the above cutting direction. On the other hand, two-dimensional cutting means that after a electronic circuit board is cut along a first side of the electronic circuit board, the cutting is continued along a second side of the electronic circuit board which is perpendicular to the first side.

In the method of cleaving a sintered multi-layer board by laser light, irregularities are formed on the cut surfaces, which can cause a crack and therefore present a problem of a low yield.

The present invention provides a method and an apparatus for manufacturing multi-layer boards, which will improve yields in the manufacturing of electronic circuit boards.

A manufacturing method according to the present invention comprises the steps of:

preparing a plurality of green sheets;

forming at least one board pattern on each of the plurality of sheets;

laminating and bonding each of the plurality of sheets to form a multi-layer board; and cutting the multi-layer board by irradiating the periphery of at least one board pattern on the surface of the multi-layer board with laser light.

Thus a section in the multi-layer board where at least one board pattern is formed is cut away from the other section of the multi-layer board. The section of the multi-layer board cut away from the other section of the multi-layer board is sintered. As a result, a multi-layer board is produced.

The unsintered multi-layer board is cut by heating and melting with laser light. This makes it possible to improve the yield in the manufacturing of electronic circuit boards.

A manufacturing apparatus according to the present invention has a stage for mounting a board. The stage moves a board in the directions of two axes which are in parallel with the board and perpendicular to each other. A laser optical unit is placed above the stage to irradiate the board mounted on the stage with laser light and cut it. The width of the cut portion in the board created by laser light is measured by a width measuring unit. A stage controller, which controls the movement of the stage, controls the velocity at which the stage moves, according to the width measured by the width measuring unit.

The kerf width can be made almost constant and narrow, by monitoring the kerf width and controlling the cutting velocity by using feedback.

BRIEF DESCRIPTION OF THE DRAWINGS

FIG. 15 is a plan view showing a procedure for cutting a multi-layer board;

FIG. 16 is a plan view showing a procedure for cutting a multi-layer board;

FIG. 17 is a side view of a multi-layer board when it is cut;

DESCRIPTION OF THE PREFERRED EMBODIMENTS

A method and an apparatus for manufacturing electronic circuit boards according to an embodiment of the present invention will now be described with reference to FIGS. 1 to 19.

First, A method for manufacturing a multi-layer electronic circuit board according to the present embodiment will be described with reference to FIG. 1.

FIG. 1 is a diagram showing the process for manufacturing a multi-layer board according to the present embodiment.

Figure 1A:
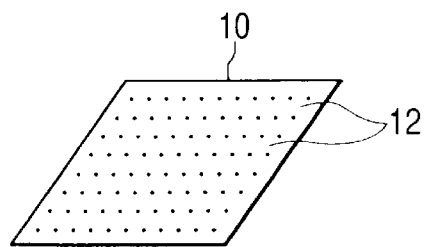
FIG. 1 is a diagram showing the process for manufacturing a multi-layer electronic circuit board according to an embodiment of the present invention.

First, as shown in FIG. 1(A), holes 12 for through holes and the like are formed in a single-layer green sheet 10 by a mechanical processing method.

Figure 1B:
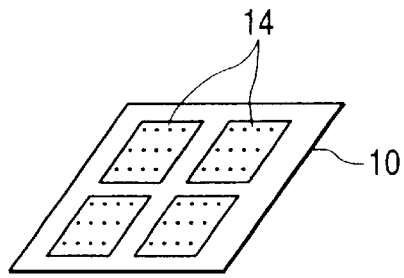

Next, as shown in FIG. 1(B), a board pattern 14 is printed on the green sheet 10.

Figure 1C:
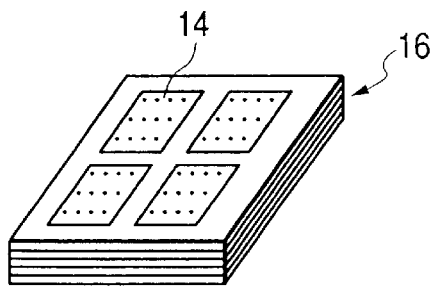

Next, as shown in FIG. 1(C), a plurality of green sheets on which the board pattern 14 is printed are laminated and bonded by pressing to form a multi-layer board 16.

Figure 1D:
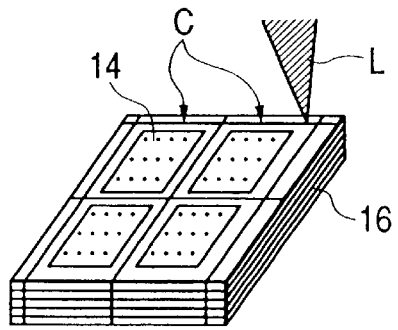

Next, as shown in FIG. 1(D), the multi-layer board 16 is cut by using laser light L along a cut line C provided according to the size of the board pattern 14, to separate into board units. By placing the multi-layer board 16 in the proximity of the focal point of a focusing lens, laser light L is converged in the proximity of the surface of the multi-layer board 16 as laser light with a small beam diameter, to cut the multi-layer board 16 by heating and melting. Incidentally, the position of the cut line C is predetermined by an optical system in order to hold the size of the board pattern 14 within tolerances.

Figure 1E:
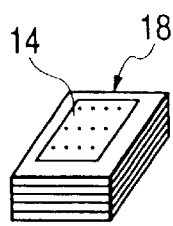

Finally, as shown in FIG. 1(E), the multi-layer board separated by laser light cutting is sintered to complete a multi-layer electronic circuit board 18. After the completion of the electronic circuit board 18, tests for conduction and the like are performed.

Conventional manufacturing processes have employed methods of stamping the multi-layer board shown in FIG. 1(C) with dies or methods of cutting the multi-layer board by a cutter blade after sintering. In the present embodiment, on the other hand, the multi-layer board is cut by using laser light, and therefore, as will be described later, the cut margin of the multi-layer board is reduced and it is possible to perform free two-dimensional cutting according to the board pattern of the multi-layer board.

It should also be noted that in the present embodiment, an unsintered multi-layer board is cut by using laser light. It is possible to cut a multi-layer board by using laser light after sintering, but in that case, damage such as the occurance of a crack or the adhesion of melt (dross) to the multi-layer board could be caused, which results in a low yield. When an unsintered multi-layer board is cut, on the other hand, stress due to the effects of heat is released and therefore no crack is caused because an unsintered multi-layer board lacks stiffness. In addition, since the melting point of the melt that is produced when an unsintered multi-layer board is heated and melted by laser light is low, the melt becomes powdery matter and thus is blown away without adhering to the cut surfaces. Even if the powder or the binder adheres, it is evaporated and removed because the multi-layer board is heated to a temperature of thousands of degrees in the sintering process following the cutting process. Therefore, the present embodiment can prevent decreases in the quality of a multi-layer board due to damage and thus increase the yield in the manufacturing of electronic circuit boards. Moreover, even when the thickness of a multi-layer board is increased because of the increase in the number of laminated layers, the multi-layer board can be readily cut.

Next, the configuration of an apparatus for manufacturing electronic circuit boards according to the present embodiment will be described with reference to FIGS. 2 to 6.

First, the general configuration of the manufacturing apparatus will be described with reference to FIG. 2.

An unsintered multi-layer board 16 is fixed and held by a fixing jig 20. The fixing jig 20 is mounted on an X-axis stage 30 and a Y-axis stage 32. The movement of the X-axis stage 30 and the Y-axis stage 32 in the X-axis direction and the Y-axis direction is controlled by a stage controller 34.

A laser light source 40 is provided above the multi-layer board 16. Laser light L emitted from the laser light source 40 is collected by a collecting lens 42 and irradiated on the multi-layer board 16. The laser light L forms a kerf G on the multi-layer board 16 to cut the multi-layer board 16. In the example shown in the figure, the stage controller 34 in this case drives the Y-axis stage 32 in the Y-axis direction to cut the multi-layer board 16 in the Y-axis direction.

When the materials for the multi-layer board 16 are mullite type ceramic materials or glass type ceramic materials, a laser in the infrared wavelength region, such as a YAG laser (wavelength of 1.06 $\mu$m) and a $CO_2$ laser (wavelength of 10.6 $\mu$m), for example, is suitable as the laser light source 40. A $CO_2$ laser is suitable especially for high-speed, high-quality cutting. According to data on the infrared absorption spectrum of a green sheet of ceramic material, the absorption factor of the green sheet at 10.6 $\mu$m is about 85%, which is especially high among infrared wavelengths, and therefore a $CO_2$ laser emitting laser light with a wavelength of 10.6 $\mu$m is suitable. In addition, a $CO_2$ laser is suitable because it operates in single mode even when the output is high. On the other hand, a YAG laser can also be used to emit laser light with infrared wavelengths to be absorbed by a green sheet, but it is not quite suitable to use for high output because it changes from single mode to multimode when the output is high.

Continuous oscillation (CW) is suitable as a laser oscillation method. Although a pulse method is often used as a normal laser oscillation method, the continuous oscillation method provides better cut surfaces with less irregularities.

In addition, a CCD camera 50 is provided above the multi-layer board 16 to pick up the image of the kerf G. The image of the kerf G picked up by the CCD camera 50 is displayed on a monitor 52 after magnified by about 100 to 200 times. An image processing unit 54 recognizes and measures the width Wg of the kerf G displayed on the monitor 52. The stage controller 34 controls the Y-axis stage 32 in such a way that the the width Wg of the kerf G measured by the image processing unit 54 is kept constant. Incidentally, when the multi-layer board 16 is cut in the direction of the X-axis, the stage controller 34 controls the X-axis stage 30. The control method of the stage controller 34 will be described later in detail.

Next, the relations between laser power, cutting velocity, and board thickness when laser cutting is performed will be described with reference to FIGS. 3 and 4.

Figure 3:
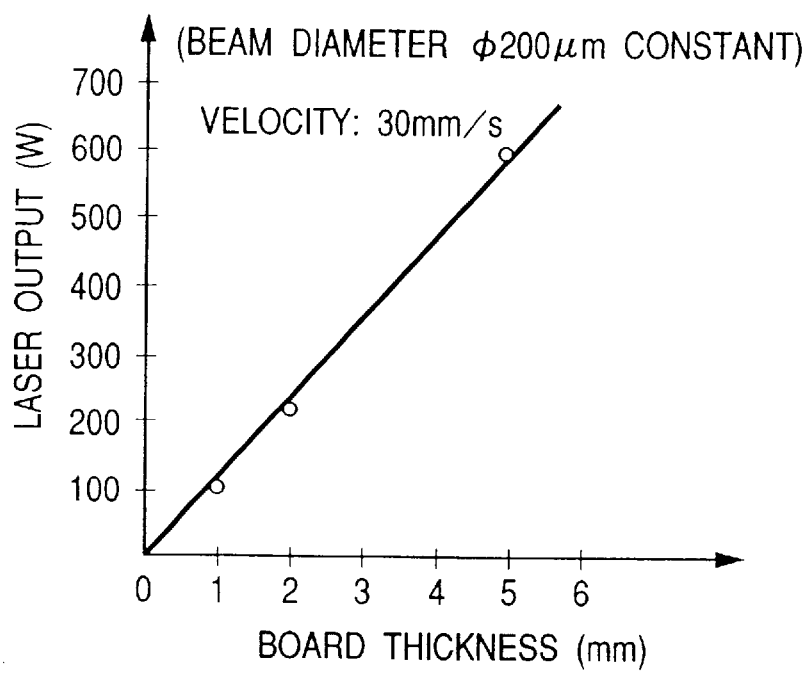
FIG. 3 is a graph showing the relation between laser power and board thickness when laser cutting is performed.

FIG. 3 shows the relation between board thickness and laser power when laminated green sheets are cut by using a continuous-oscillation $CO_2$ laser. In FIG. 3, the axis of ordinates denotes laser power (W), while the axis of abscissas denotes board thickness (mm). Here, the cutting velocity of the continuous-oscillation $CO_2$ laser is set to be constant at 30 mm/s, while the beam diameter of the continuous-oscillation $CO_2$ laser is set to be constant at $\phi 200$ μm.

It is clear from the graph that when the diameter of the collected beam is set to be constant, the laser power is almost in a proportional relation with the board thickness. For example, in order to cut a board with a thickness of 5 mm, the laser power needs to be set at about 600 W. Thus, in order to cut a board with a thickness of 10 mm at a cutting velocity of 30 mm/s, for example, the laser power needs to be set at 1 kW or more.

Figure 4:
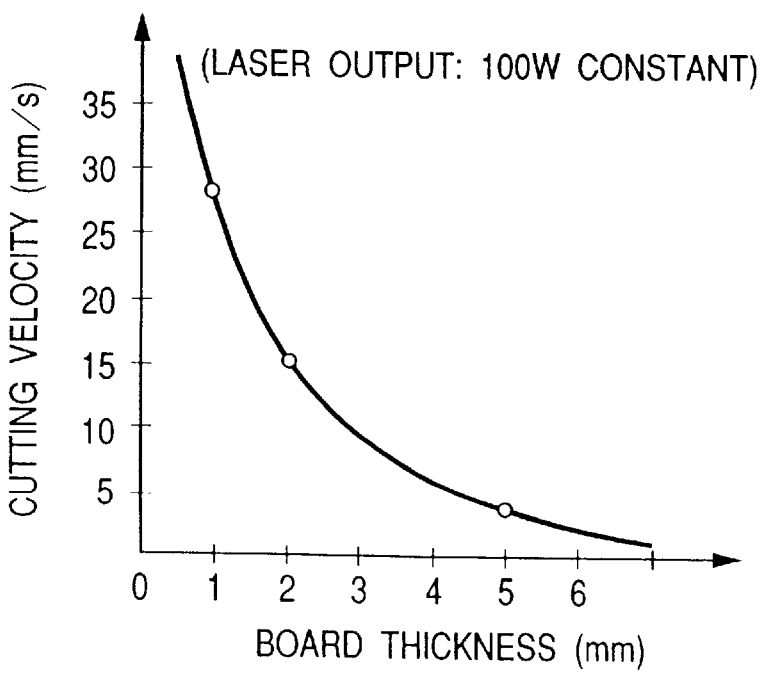
FIG. 4 is a graph showing the relation between cutting velocity and board thickness when laser cutting is performed.

On the other hand, FIG. 4 shows the relation between board thickness and cutting velocity when laminated green sheets are cut by using a continuous-oscillation $CO_2$ laser. In FIG. 4, the axis of ordinates denotes cutting velocity (mm/s), while the axis of abscissas denotes board thickness (mm). Here, the laser power of the continuous-oscillation $CO_2$ laser is set to be constant at 100 W, while the beam diameter of the continuous-oscillation $CO_2$ laser is set to be constant at $\phi 200$ μm.

It is clear from the graph that when the diameter of the collected beam is set to be constant, the cutting velocity is almost in an inversely proportional relation with the board thickness. For example, in order to cut a board with a thickness of 5 mm, the cutting velocity needs to be set at 3 to 4 mm/s. Thus, in order to cut a board with a thickness of 10 mm at a laser power of 100 W, for example, the cutting velocity needs to be set at about 1 mm/s.

It is shown from the above descriptions that when the thickness of a multi-layer board is about 1 mm, the multi-layer board can be cut in a satisfactory manner by setting the output of the $CO_2$ laser at about 120 W and setting the cutting velocity of the $CO_2$ laser at 30 mm/s or more. The kerf width can be reduced to 150 to 190 μm by using a 1-inch (25.4 mm) collecting lens.

Next, a control method for kerf width according to the present embodiment will be described with reference to FIGS. 5 and 6.

Figure 5:
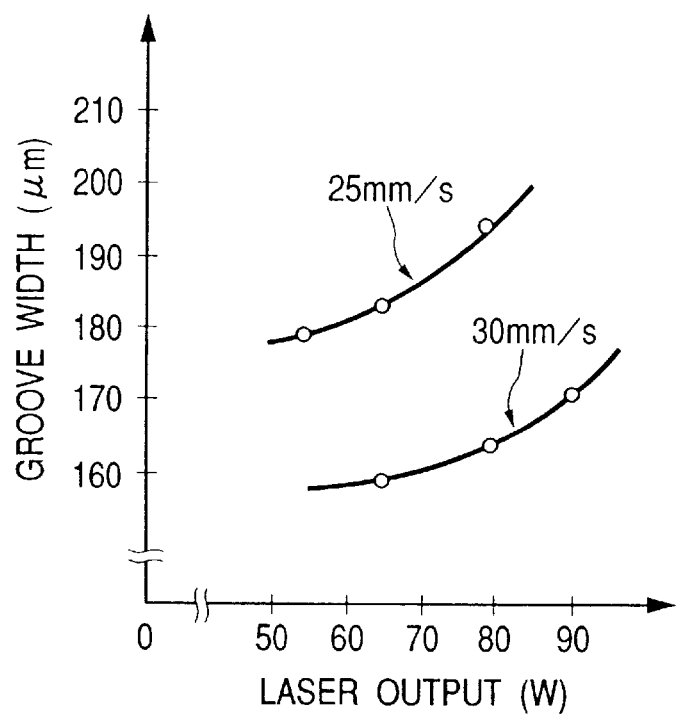
FIG. 5 is a graph showing the relation between kerf width and laser power when laser cutting is performed.
Figure 6:
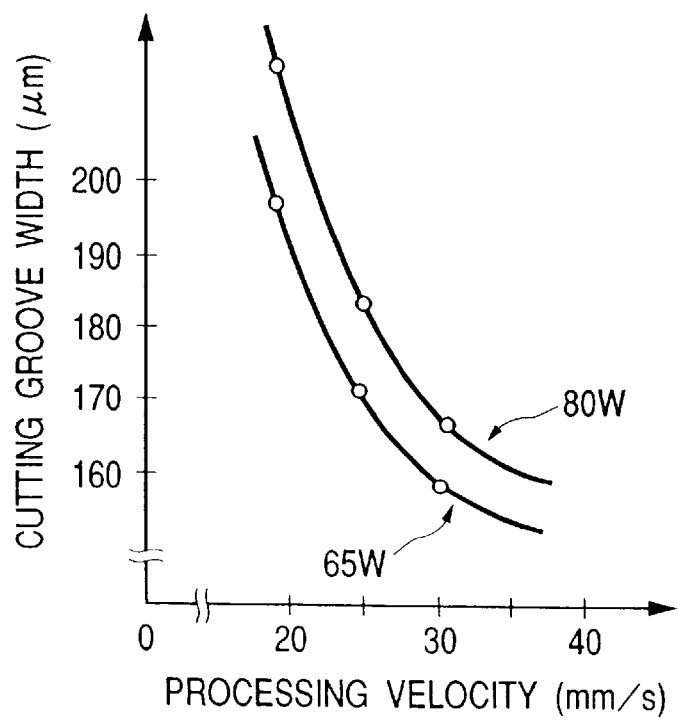
FIG. 6 is a graph showing the relation between kerf width and cutting velocity when laser cutting is performed.

FIGS. 5 and 6 show changes in kerf width according to cutting conditions.

When a board is cut by using a laser light, the kerf width of the board is constant unless cutting conditions change. However, if the tolerance accuracy must be a few μm, the kerf width of the board needs to be controlled in such a way that it is held constant.

FIG. 5 shows the dependence of kerf width on laser power.

In FIG. 5, the axis of ordinates denotes kerf width (μm), while the axis of abscissas denotes laser power (W). FIG. 5 shows the relation of kerf width to laser power in two cases where cutting velocity is 25 mm/s and where cutting velocity is 30 mm/s. When the cutting velocity is the same, a 10 W change in the laser power does not cause a wide range of change in the kerf width. The changes in the kerf width in this case are within 5 μm.

On the other hand, FIG. 6 shows the dependence of kerf width on cutting velocity.

In FIG. 6, the axis of ordinates denotes kerf width (μm), while the axis of abscissas denotes cutting velocity (mm/s). FIG. 6 shows the relation of kerf width to cutting velocity in two cases where laser power is 65 W and where laser power is 80 W. It is clear from the figure that when the laser power is the same, a 10 mm/s change in the cutting velocity causes a wide range of change in the kerf width. The changes in the kerf width in this case are about 10 to 30 μm.

Figure 2:
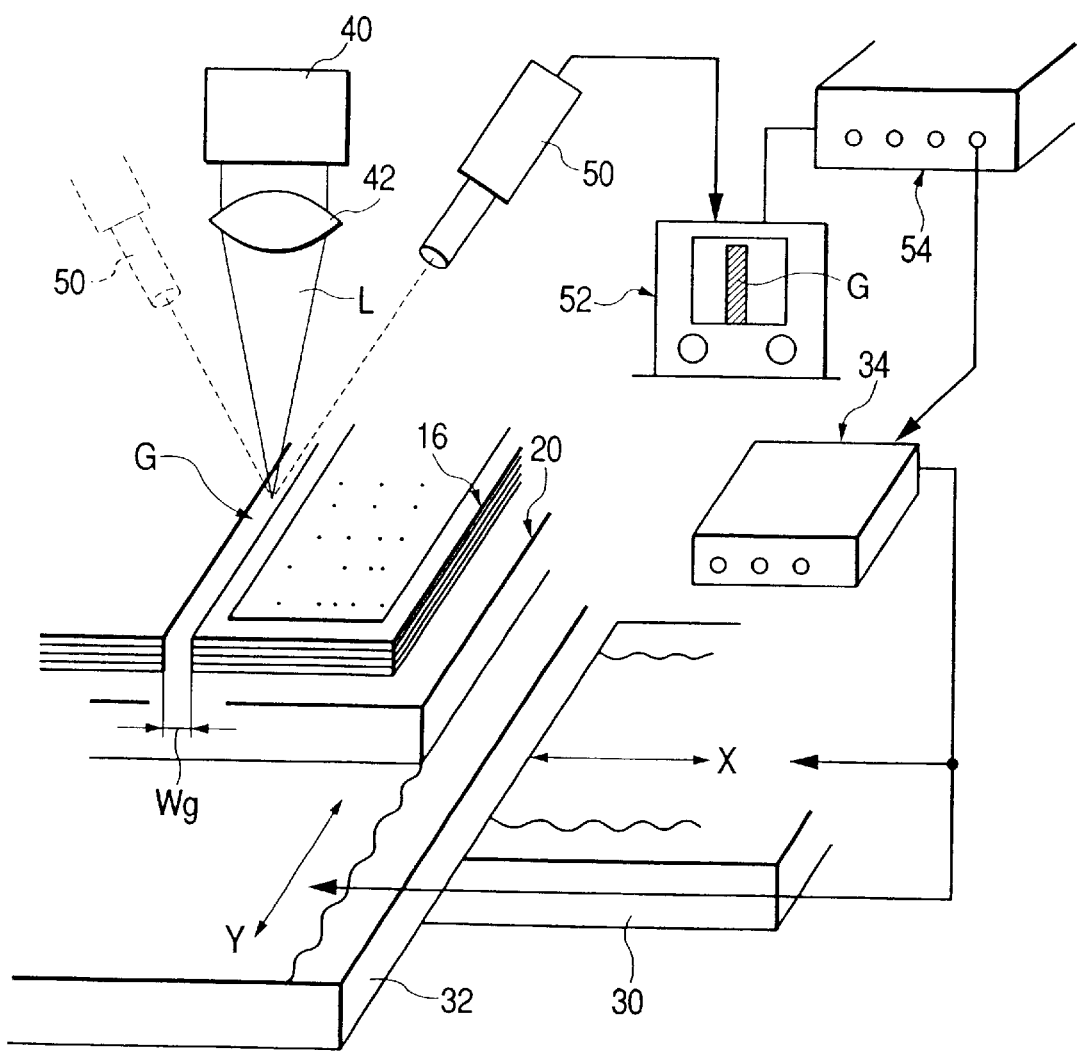
FIG. 2 is a perspective view showing the general configuration of an apparatus for manufacturing electronic circuit boards according to an embodiment of the present invention.

In order to deal with this, the image processing unit 54 in the manufacturing apparatus as shown in FIG. 2 recognizes and measures the width of the kerf G picked up by the CCD camera 50. The image of the kerf G picked up by the CCD camera 50 is also displayed on the monitor 52. The stage controller 34 controls the Y-axis stage 32 in such a way that the the width of the kerf G measured by the image processing unit 54 is kept constant. As shown in FIG. 6, the kerf width is decreased as the the cutting velocity is increased. Therefore, the stage controller 34 controls the moving velocity of the Y-axis stage 32, that is, the cutting velocity by using feedback in such a way that the cutting velocity is increased when the comparision of a target kerf width with the measured kerf width shows that the measured kerf width is larger than the target kerf width, whereas the cutting velocity is decreased when the comparision of a target kerf width with the measured kerf width shows that the measured kerf width is smaller than the target kerf width. The target kerf width is determined by the stage controller 34 from the beam diameter (focused diameter) of laser light irradiated on the multi-layer board. Or the target kerf width may be preset in the stage controller 34. Or the stage controller 34 may recognize the target kerf width by other methods. Incidentally, when the multi-layer board is cut in the direction of the X-axis, the stage controller 34 controls the moving velocity of the X-axis stage 30 by using feedback.

The feedback control of the cutting velocity by the stage controller 34 allows the kerf width to be kept constant. Since the kerf width is made almost constant, the cut line of the multi-layer board after cutting can be made almost linear.

Next, a laser optical system used in the manufacturing apparatus will be described with reference to FIGS. 7 to 11.

Figure 7:
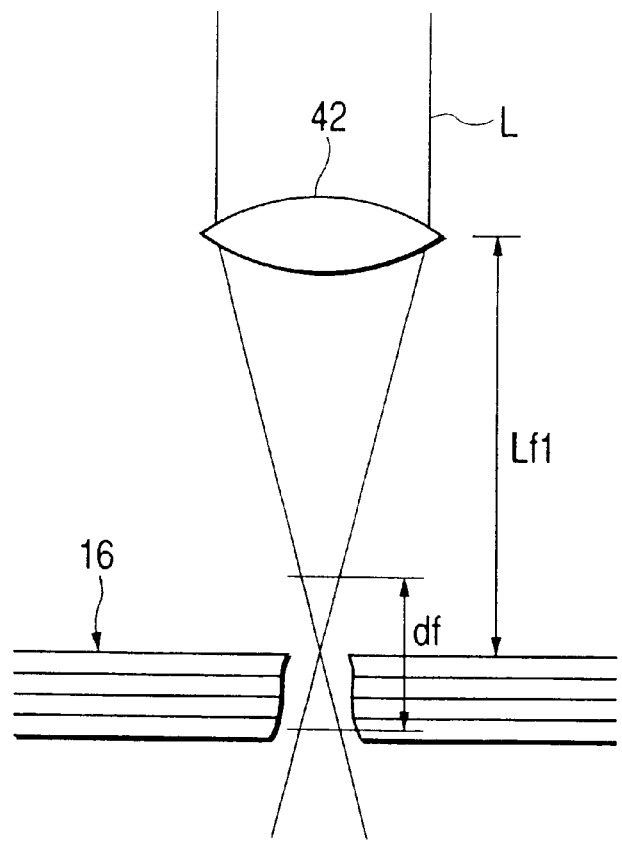
FIG. 7 is a diagram for explaining the conditions of laser light collection and the shape of cut surfaces.

First, the conditions of laser collection and the shape of cut surfaces will be described with reference to FIGS. 7 and 8.

When laser cutting is performed, the manufacturing apparatus uses a collecting lens 42 to collect and irradiate a multi-layer board 16 with laser light L. In the case of a multi-layer board 16 with a thickness of about 1 mm, the multi-layer board 16 can be cut in a satisfactory manner even when the focal length Lfl of the collecting lens 42 is about 1 inch (25.4 mm), and the shape of cut surfaces is straight, and not tapered. In general, the shorter the focal length Lfl of the collecting lens 42 is, the smaller the focused diameter of the laser light can be made, which therefore results in a smaller cut width.

Figure 8:
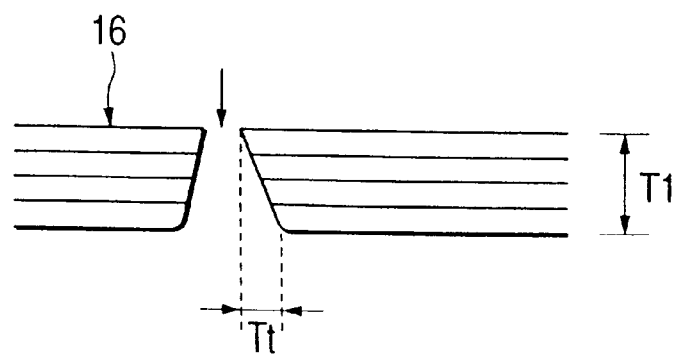
FIG. 8 is a diagram for explaining the conditions of laser light collection and the shape of cut surfaces.

However, as shown in FIG. 8, if the thickness Tl of the multi-layer board 16 becomes 5 mm or more, the cut surface of the multi-layer board 16 aquires a tapered shape and the amount of taper Tt of the cut surface increases in proportion to the thickness Tl of the multi-layer board 16. In order to solve this problem, the focal length Lfl of the collecting lens 42 shown in FIG. 7 should be increased, and the focal depth df of the collecting lens 42 should also be increased. Inventors considered the focal length of the collecting lens that can reduce the amount of taper of a cut surface by changing the thickness of a multi-layer board. As a result, it was shown that the amount of taper Tt of the cut surface is made to be 10 μm or less by setting the focal length of the collecting lens at 3.5 inches when the thickness of the multi-layer board is about 2 mm, by setting the focal length of the collecting lens at 5 inches when the thickness of the multi-layer board is about 5 mm, and by setting the focal length of the collecting lens at 7 inches when the thickness of the multi-layer board is about 10 mm. Incidentally, the focal depth df of the collecting lens is the distance between the points where the beam diameter of the laser light becomes twice as large as the focused diameter of the laser light at the focal point. For example, if the focused diameter of the laser light is 200 μm, the focal depth df of the collecting lens is the distance between the points where the beam diameter of the laser light becomes 400 μm.

Figure 9:
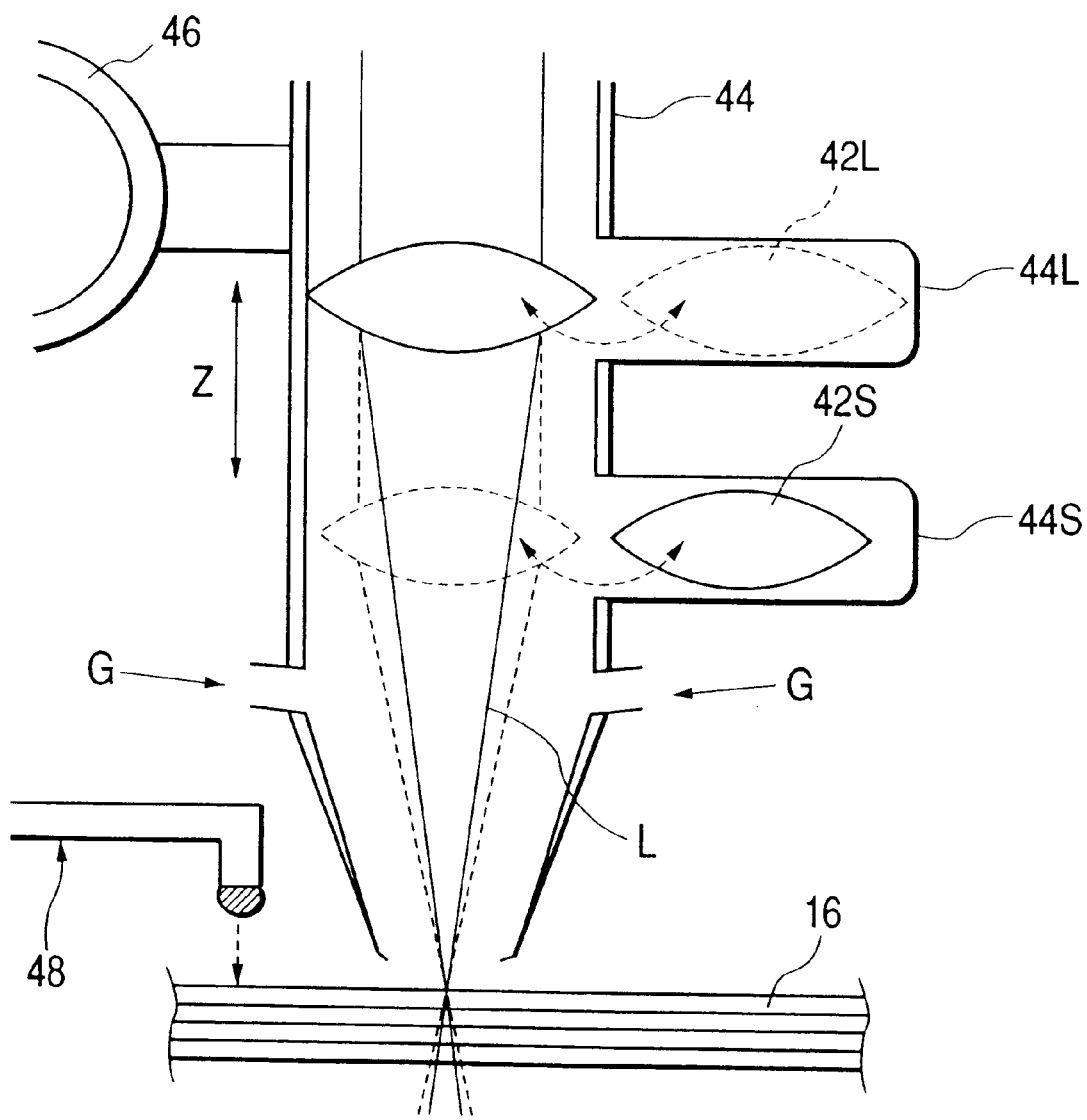
FIG. 9 is a configuration view of a laser optical system.

Next, a laser optical system used in the manufacturing apparatus will be described with reference to FIG. 9.

Two collecting lenses 42L and 42S are placed inside the casing 44 of the laser optical system. The collecting lens 42L has a long focal length. The focal length of the collecting lens 42L is 7 inches, for example. The collecting lens 42S has a short focal length. The focal length of the collecting lens 42S is 5 inches, for example. The casing 44 is provided with a housing 44L for the collecting lens 42L and a housing 44S for the collecting lens 42S. The collecting lens 42L can be made to move between a position in the housing 44L and a position on the optical axis by using a revolver or the like, which is not shown in the figure. Similarly, the collecting lens 42S can be made to move between a position in the housing 44S and a position on the optical axis by using a revolver or the like, which is not shown in the figure. Either the collecting lens 42L or the collecting lens 42S is placed on the optical axis of the laser light L emitted from the laser light source.

The casing 44 can be moved in the direction of the arrow Z by a vertical driving mechanism 46. Also, the casing 44 is externally supplied with air assist gas G from its sides in the Z direction. The casing 44 is designed to blow the supplied air assist gas on the portion being cut by the laser.

In addition, the laser optical system is provided with a contact height sensor 48. The contact height sensor 48 comes in contact with the surface of the multi-layer board 16 to measure the thickness of the multi-layer board 16.

The relation between the focal point of the laser optical system and the shape of cut surfaces will be described with reference to FIGS. 10 and 11.

FIG. 10 shows the relation between the focal point of the laser optical system and the shape of cut surfaces when the thickness of the multi-layer board 16 is large.

Figure 10A:
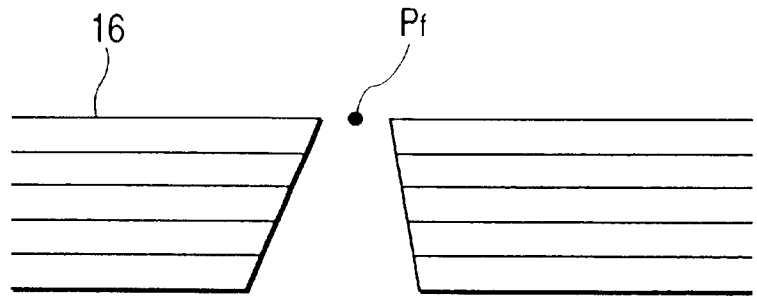
FIG. 10 is a sectional view showing the relation between the focal point of a laser optical system and the shape of cut surfaces.

FIG. 10(A) shows the shape of cut surfaces when the focal point Pf of a collecting lens is located at a point on the surface of the multi-layer board 16. As shown in the figure, the cut surfaces are tapered when the focal point Pf of the collecting lens is located at a point on the surface of the multi-layer board 16.

Figure 10B:
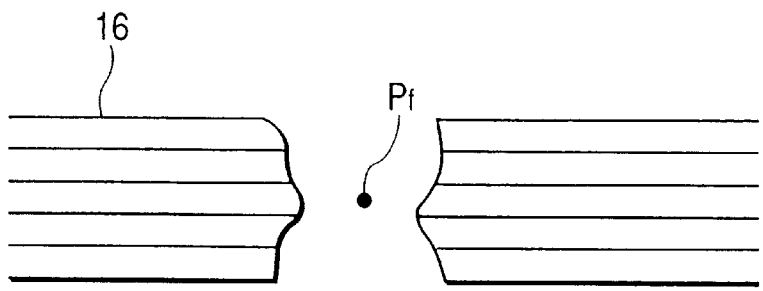

On the other hand, FIG. 10(B) shows the shape of cut surfaces when the focal point Pf of the collecting lens is located at a point inside the multi-layer board 16. As shown in the figure, the cut surfaces have a convex shape with the middle parts of the cut surfaces projecting when the focal point Pf of the collecting lens is located at a point inside the multi-layer board 16.

Figure 10C:
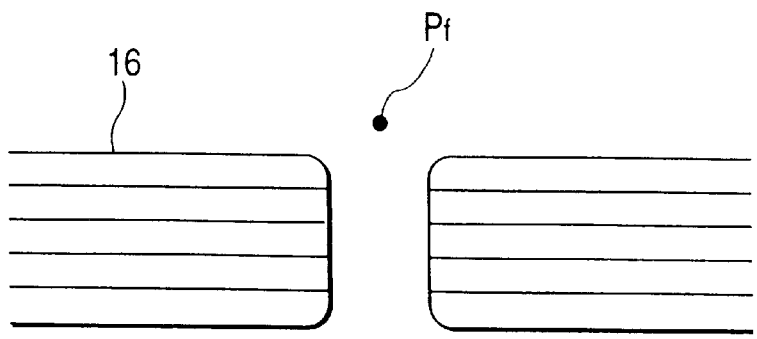

On the other hand, FIG. 10(C) shows the shape of cut surfaces when the focal point Pf of the collecting lens is located at a point 0.1 to 0.2 mm above the surface of the multi-layer board 16. As shown in the figure, the cut surfaces have a straight shape with little taper when the focal point Pf of the collecting lens is located at a point way above the surface of the multi-layer board 16. When the focal point Pf of the collecting lens is located at a point 0.1 to 0.2 mm above the surface of the multi-layer board 16, the beam shape of the laser light is trapezoidal, with a small beam diameter on the upper surface side of the multi-layer board and a large beam diameter on the lower surface side of the multi-layer board. Since the energy density of the laser light is high on the upper surface side of the multi-layer board, however, the multi-layer board tends to be heated and melted more easily on the upper surface side. As a result, the cut surfaces have a straight shape with little taper. Thus, according to the present embodiment, the manufacturing apparatus locates the the focal point Pf of the collecting lens at a point 0.1 to 0.2 mm above the surface of the multi-layer board 16.

On the other hand, FIG. 11 shows the shape of cut surfaces when the thickness of the multi-layer board 16 is small. When the thickness of the multi-layer board 16 is small, either a collecting lens with a long focal length or a collecting lens with a short focal length can be used to make the shape of cut surfaces straight.

Figure 11A:
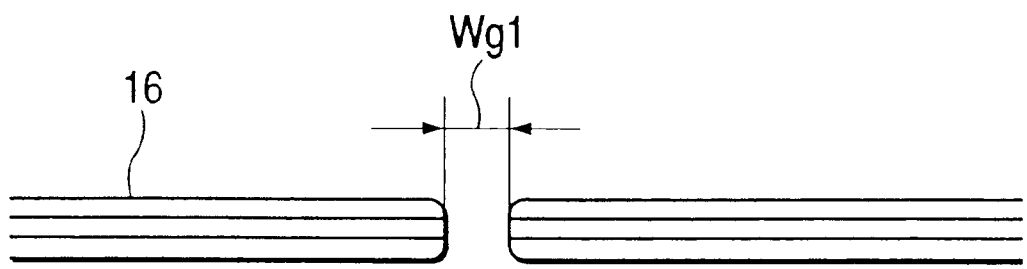
FIG. 11 is a sectional view of the shape of cut surfaces.
Figure 11B:
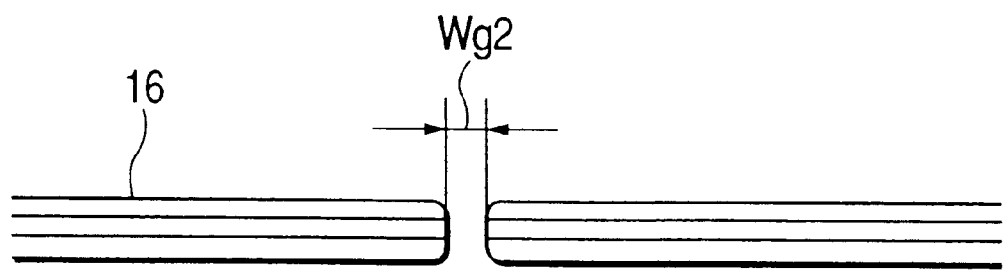

However, if a lens with a long focal length is used, the kerf width results in Wg1, as shown in FIG. 11(A). On the other hand, if a lens with a short focal length is used, the kerf width results in Wg2, as shown in FIG. 11(B). Here, the kerf width Wg1 is larger than the kerf width Wg2. This is because the beam diameter at the focal point of the lens with a long focal length is larger than the beam diameter at the focal point of the lens with a short focal length. For example, the beam diameter at the focal point of a collecting lens with a focal length of 1 inch is about 200 μm, while the beam diameter at the focal point of a collecting lens with a focal length of 5 inches is about 250 to 300 μm.

Therefore, when the multi-layer board 16 with a small thickness is to be cut by laser light, either a collecting lens with a long focal length or a collecting lens with a short focal length can be used; however, in order to narrow the kerf width, it is desirable to use a collecting lens with a short focal length. On the other hand, when a multi-layer board 16 with a large thickness is to be cut by laser light, it is required to use a collecting lens with a long focal length. Therefore, as described in FIG. 9, the laser optical system switches between the collecting lens 42L with a long focal length and the collecting lens 42S with a short focal length, according to the thickness of the multi-layer board.

Next, the operation of the laser optical system will be described.

First, after a multi-layer board 16 is fixed and held by the fixing jig 20 as shown in FIG. 2, the contact height sensor 48 comes in contact with the surface of the multi-layer board 16 to measure the thickness of the multi-layer board 16. If the thickness of the multi-layer board 16 is larger than a specified thickness, the collecting lens 42L with a long focal length is set on the optical axis. Then the casing is moved in the Z direction by the vertical driving mechanism 46 so as to locate the focal point of the collecting lens 42L at a point 0.1 to 0.2 mm above the surface of the multi-layer board 16.

If the thickness of the multi-layer board 16 is smaller than the specified thickness, the collecting lens 42S with a short focal length is set on the optical axis. Then the casing is moved in the Z direction by the vertical driving mechanism 46 so as to locate the focal point of the collecting lens 42S at a point 0.1 to 0.2 mm above the surface of the multi-layer board 16.

Next, the configuration of the unit for removing cutting powder will be described with reference to FIGS. 12 and 13. Incidentally, identical numerals in FIGS. 2 and 9 denote identical parts.

Figure 12:
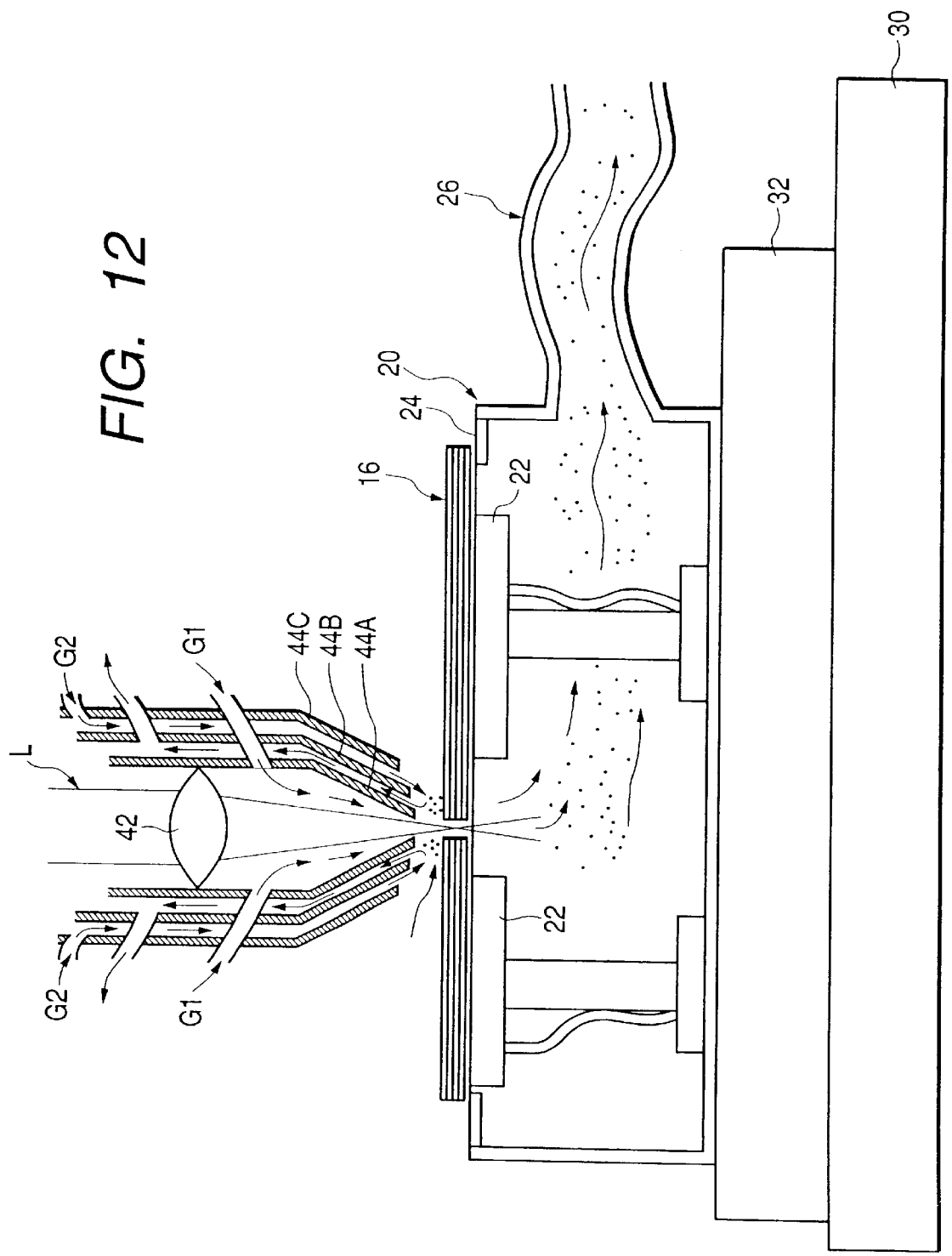
FIG. 12 is a diagram of a configuration for removing cutting powder according to an embodiment of the present invention.

As shown in FIG. 12, the fixing jig 20 that holds the multi-layer board 16 comprises a fixing suction unit 22 which fixes the multi-layer board 16 by suction, a space box 24 which has space inside and is placed in such a way as to cover the fixing suction unit 22, and a hose 26 connected to a dust absorb cleaner not shown in the figure. The space box 24 has an approximately rectangular parallelepiped shape, and has an opening on the upper surface. The fixing suction unit 22 is placed at the opening of the space box 24. When the multi-layer board 16 is sucked and fixed by the fixing suction unit 22, the opening of the space box 24 is closed by the multi-layer board 16, and the space inside the space box 24 is brought almost to a sealed state.

When the multi-layer board 16 is cut by laser light L, cutting powder is produced. Since the inside of the space box 24 connected with the hose 26 is sucked by the dust absorb cleaner, the cutting powder produced is absorbed from the space box 24 to the outside via the hose 26. The space inside the space box 24 is brought nearly to a sealed state by fixing and holding the multi-layer board 16 to the fixing suction unit 22, thereby resulting in a high dust absorbing efficiency.

Figure 13:
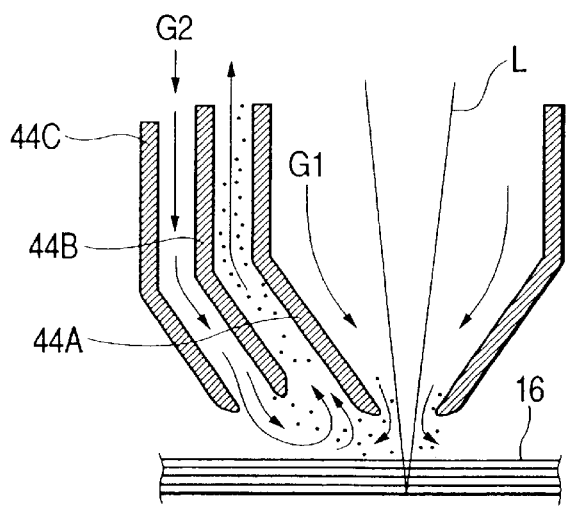
FIG. 13 is a diagram of a configuration for removing cutting powder according to an embodiment of the present invention.

As shown under magnification in FIG. 13, the casing 44 that holds the collecting lens 42 has a triple nozzle structure comprising three nozzles 44A, 44B, and 44C each placed on the same axis. The nozzle 44A holds the collecting lens 42. In addition, the nozzle 44A has at least one gas leader and blows the air assist gas G1 led in from the outside through the gas leader onto the portion of the multi-layer board 16 being cut by laser light L. The cutting powder produced in the proximity of the portion of the multi-layer board 16 being cut by laser light L is blown away by the air assist gas G1, and at least part of the cutting powder is blown into the space box 24. The nozzle 44B has at least one absorber. The space between the innermost nozzle 44A and the intermediate nozzle 44B is sucked by an absorbing means, which is not shown in the figure, via the absorber. Another part of the cutting powder blown away the air assist gas G1 is absorbed by the absorbing means. Furthermore, the nozzle 44C has at least one gas leader, and air assist gas G2 is led into the space between the outermost nozzle 44C and the intermediate nozzle 44B from the outside through the gas leader. The air assist gas G2 is blown onto the multi-layer board 16 in such a way that the cutting powder blown away by the air assist gas G1 will not fly to the outside. As a result, the part of the cutting powder that did not enter the space box 24 is absorbed into the space between the nozzle 44B and the nozzle 44A.

When the gas pressure of the air assist gas G1 is 5 kg/cm$^2$, for example, the gas pressure of the air assist gas G2 is set to be 2 kg/cm$^2$, for example. By making the gas pressure of the air assist gas G2 lower than the gas pressure of the air assist gas G1, the air assist gas G2 can be used as an air curtain.

Next, the method of cutting a multi-layer board will be described with reference to FIGS. 14 to 16.

Figure 14:
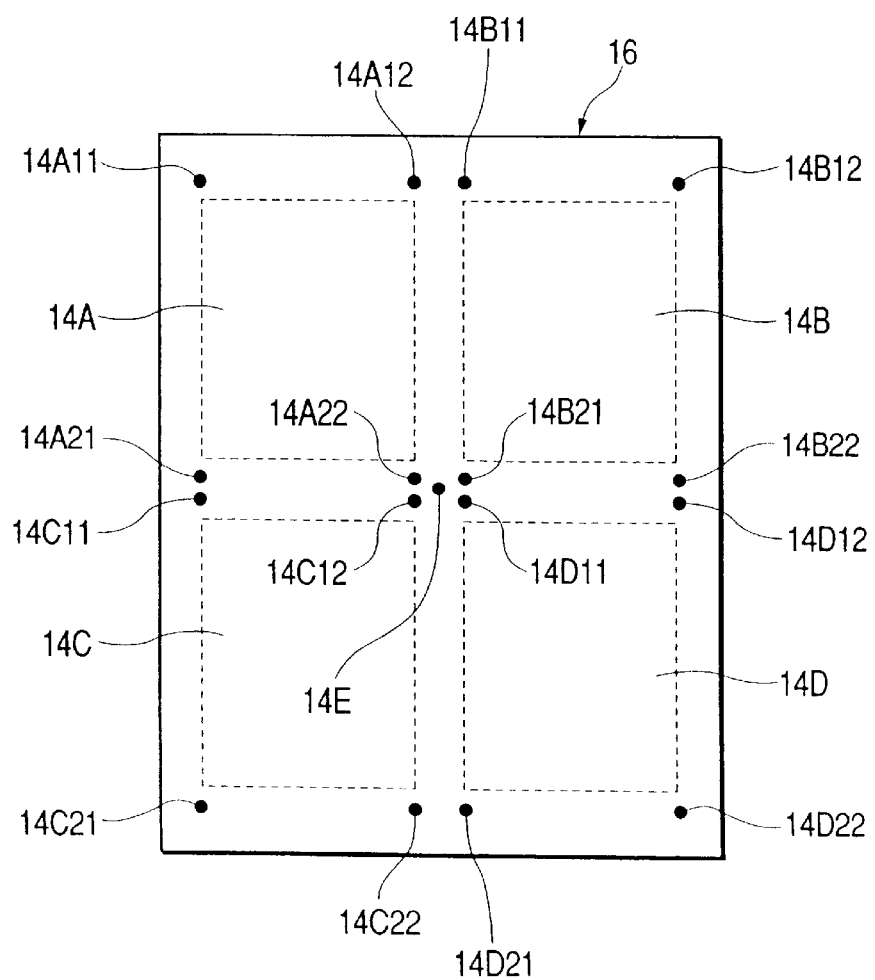
FIG. 14 is a plan view of a multi-layer board.

In the example shown in FIG. 14, four board print patterns 14A, 14B, 14C, and 14D are formed on a multi-layer board 16 laminated with green sheets. Also, pads 14A11, 14A12, 14A21, 14A22; 14B11, 14B12, 14B21, 14B22; 14C11, 14C12, 14C21, 14C22; 14D11, 14D12, 14D21, and 14D22 are formed on the multi-layer board 16 in such a way that the pads surround each of the board print patterns 14A, 14B, 14C, and 14D. Each pad is individually formed on the outside of each corner of each of the board print patterns. A center position pad 14E is formed at the center of the multi-layer board 16.

When the multi-layer board 16 held by the fixing jig 20 as shown in FIG. 2 is mounted on the Y-axis stage 32, the CCD camera 50 picks up the image of the upper surface of the multi-layer board 16. The CCD camera 50 picks up the image of each section of the upper surface of the multi-layer board 16 by moving the CCD camera 50, or the Y-axis stage 32 and the X-axis stage 30. When each of the pads 14A11, 14B12, 14C21, 14D22 is picked up by the CCD camera 50, the image processing unit 54 detects the position of each of the pads in the X-Y coordinate system, and calculates the position of the center of gravity of the four pads. Then, after the center position pad 14E is picked up by the CCD camera 50, the image processing unit 54 detects the position of the center position pad in the X-Y coordinate system, and calculates the difference between the position of the center position pad and the above-mentioned position of the center of gravity of the four pads. The stage controller 34 operates the Y-axis stage 32 and the X-axis stage 30 according to the calculated difference to correct the position of the multi-layer board 16.

Next, the method of cutting a section in the multi-layer board where a board print pattern is formed will be described.

When the section in the multi-layer board 16 where the board print pattern 14A is formed is to be cut by laser light, for example, the pads 14A11, 14A12, 14A21, and 14A22 are picked up by the CCD camera 50. The image processing unit 54 detects the position of each of the pads in the X-Y coordinate system. Then the image processing unit 54 calculates the position 14g of the center of gravity of the four pads. With the position 14g of the center of gravity set to be the center, positions away from the center by a distance Lx in the lateral direction (x direction) and positions away from the center by a distance Ly in the vertical direction (y direction) form cutting lines. If the size of the section to be cut is 65 mm×70 mm, for example, Lx is set to be 32.5 mm and Ly is set to be 35 mm. In order to irradiate a start point S with laser light L as shown in FIG. 15, the stage controller 34 operates the X-axis stage and the Y-axis stage, putting the multi-layer board 16 in place. The laser light source 40 begins to irradiate the start point S with laser light L. The stage controller 34 first drives the X-axis stage 30 to irradiate the multi-layer board 16 with laser light L along the cutting line C1. The laser light L cuts the multi-layer board 16 along the cutting line C1, starting at the start point S. When the point where the laser light L is irradiated reaches the point where the cutting line C1 and the cutting line C2 cross each other, the stage controller 34 stops the operation of the X-axis stage 30, and drives the Y-axis stage 32 to irradiate the multi-layer board 16 with laser light L along the cutting line C2. This allows the multi-layer board 16 to be cut along the cutting line C2 continuously from the point where the cutting line C1 and the cutting line C2 cross each other. Similarly, the multi-layer board 16 is cut in the manner of one stroke writing along the cutting line C3 and along the cutting line C4 in that order. As a result, the board print pattern 14A is cut off.

Incidentally, if the multi-layer board 16 is cut at a high cutting velocity of 30 mm/s or more, the corner sections of the multi-layer board 16 that should have a rectangular cut shape (or the sections where the cutting lines cross each other; for example, the corner section Z in FIG. 15) may be rounded, and therefore the right angle formed at the corner sections may be decreased. Therefore when the cutting velocity is high, cutting is performed along the cutting lines C1, C3, C2, and C4 in that order, as shown in FIG. 16. Specifically, the multi-layer board 16 is cut along the cutting line C1 and then is cut along the cutting line C3. Next the multi-layer board 16 is cut along the cutting line C2 and then is cut along the cutting line C4. Since the four sides of the multi-layer board 16 are cut independently of each other, the right angles of the corner sections that should have a rectangular cut shape are improved.

Next, the side shape of the multi-layer board when it is cut will be described with reference to FIG. 17.

When the multi-layer board 16 is cut along the cutting line C by heating and melting with laser light, the shape of the multi-layer board 16 viewed from the side of the cut portion has arcs with a radius of R at the edge on the upper side and at the edge on the lower side, as shown in FIG. 17. For example, if a multi-layer board with a thickness of 1 mm is cut by laser light, the radius R is about 5 to 7 μm. In general, if a cutter or a die is used for cutting, the sharp cutting edge allows the edges of the cut portion to form right angles. On the other hand, when laser light is used for cutting, the edges of the cut portion are rounded because the multi-layer board is cut by the heat of laser light. The rounded edges present no problem in terms of size accuracy, and they are rather free from problems such as the chipping of the edges during handling work with multi-layer boards after cutting. This improves yields in the manufacturing of electronic circuit boards.

Next, the cut shape of the multi-layer board will be described with reference to FIGS. 18 to 20.

Figure 18A:
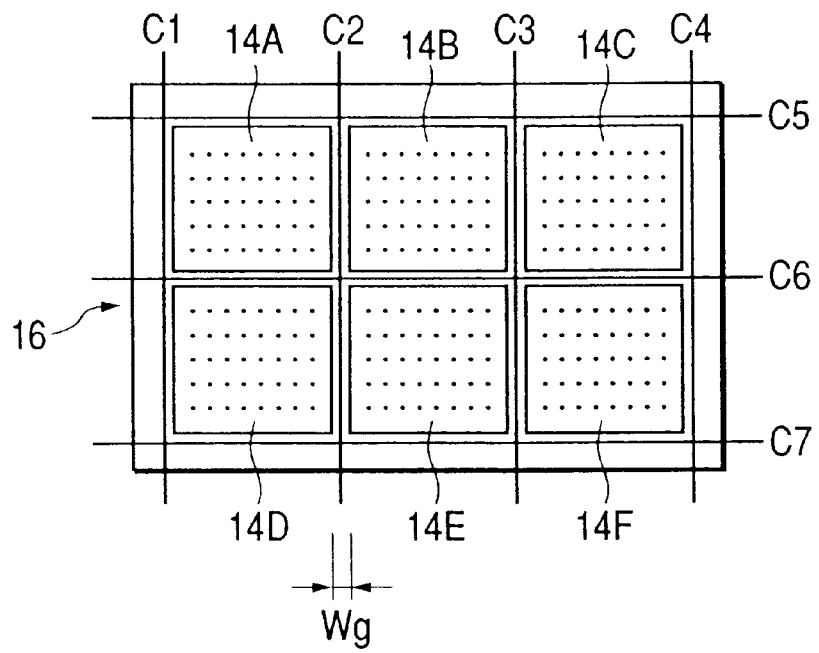
FIG. 18 is a plan view showing the cut shape of a multi-layer board.

As shown in FIG. 18(A), six board print patterns 14A, 14B, 14C, 14D, 14E, and 14F are formed on a multi-layer board 16. When the six board print patterns are to be cut by laser light, the multi-layer board 16 is cut by laser light along the cutting lines C1, C2, C3, C4, C5, C6, and C7. Since the cutting width Wg according to the present embodiment is about 200 μm, the cutting between the board print patterns 14A and 14B, for example, is completed in a single cutting operation along the cutting line C2. In addition, if the distance between the board print patterns 14A and 14B is made equal to the cutting width Wg of 200 μm, then the number of board print patterns that can be cut off from a single multi-layer board 16 will be increased.

Figure 18B:
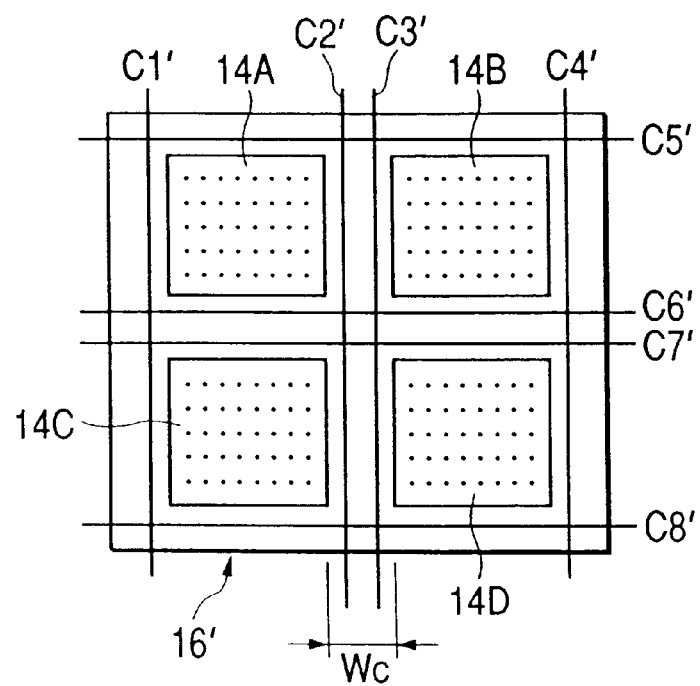

For reference, the cut shape of the multi-layer board when it is cut by means other than laser light will be described with reference to FIG. 18(B).

Four board print patterns 14A, 14B, 14C, and 14D are formed on a multi-layer board 16'. In order to cut the four board print patterns by using a cutter, for example, the multi-layer board is cut along the cutting lines C1', C2', C3', C4', C5', C6', C7', and C8'. When the multi-layer board is cut by a cutter, a cutting portion for the cutter is required. Therefore, the width Wc between the the board print pattern 14A and the board print pattern 14B, for example, is required to be about 5 mm. As a result, the number of patterns that can be cut off from a single multi-layer board 16 is limited. Also, when board print patterns are stamped by a die, a similar problem is presented. Specifically, the width Wc between the the board print pattern 14A and the board print pattern 14B is required to be at least about 5 mm because the stiffness of the stamping die needs to be maintained.

Figure 19:
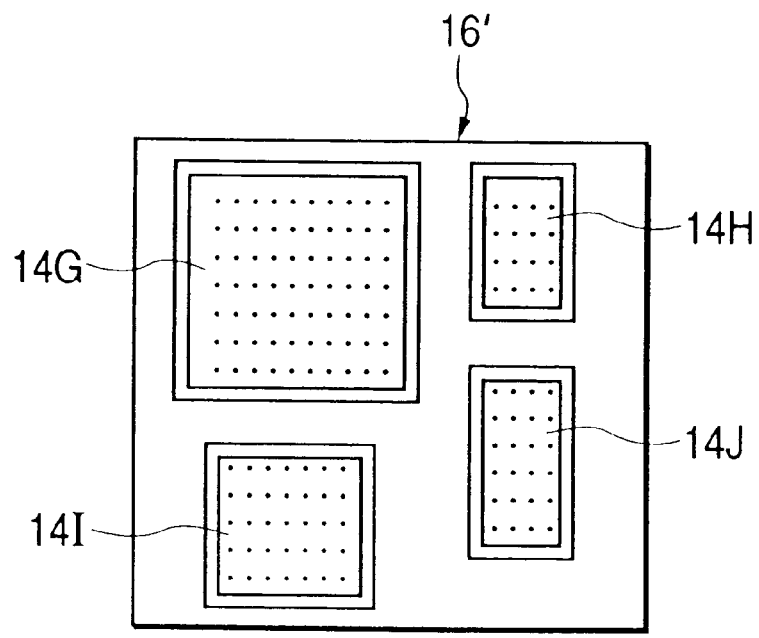
FIG. 19 is a plan view showing the cut shape of a multi-layer board.

FIG. 19 shows other examples of cut shapes.

As shown in FIG. 19, four board print patterns 14G, 14H, 14I, and 14J are formed on a multi-layer board 16'. These four board print patterns have shapes of different sizes from one another. Cutters cannot be used for such board print patterns with shapes of different sizes from one another. On the other hand, laser light is able to cut the multi-layer board 16' along each of the circumferences of the board print patterns 14G, 14H, 14I, and 14J in the manner of one stroke writing as shown in FIG. 15. Therefore, laser light can be applied to various types of board print patterns.

Figure 20:
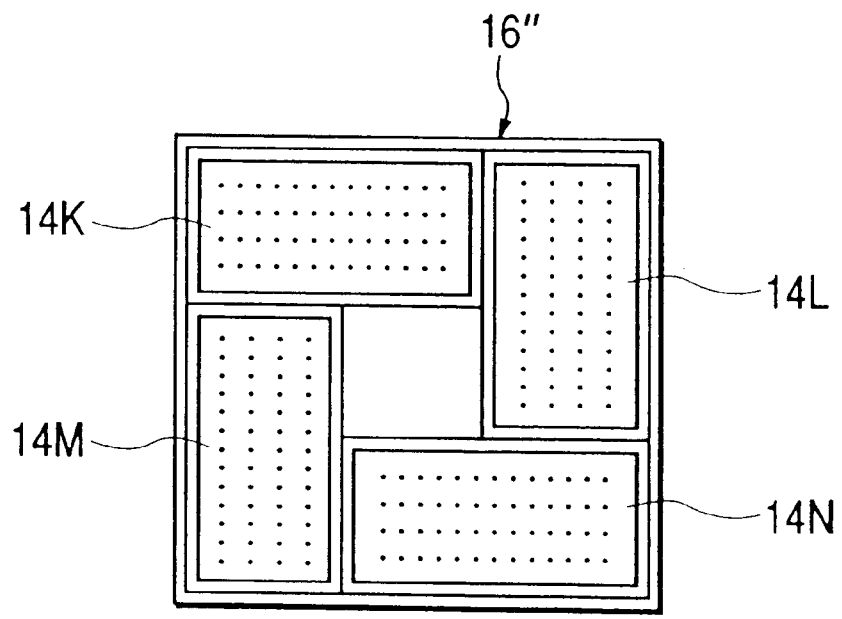
FIG. 20 is a plan view showing the cut shape of a multi-layer board.

Next, FIG. 20 shows other examples of cut shapes.

As shown in FIG. 20, four board print patterns 14K, 14L, 14M, and 14N are formed on a multi-layer board 16". These four board print patterns have a shape of the same size; however, the board print patterns are arranged in such a way as to increase the number of patterns that can be cut off from a single multi-layer board 16". Cutters cannot be used for board print patterns with such two-dimensional shapes. On the other hand, laser light is able to cut the multi-layer board 16" along each of the circumferences of the board print patterns 14K, 14L, 14M, and 14N in the manner of one stroke writing as shown in FIG. 15. Therefore, laser light can also be applied to board print patterns with two-dimensional shapes.

As described above, an unsintered multi-layer board is cut by heating and melting with laser light. This improves yields in the manufacturing of electronic circuit boards.

In addition, optimum cut shape and kerf width can be obtained according to the thickness of the multi-layer board by switching between a lens with a long focal length and a lens with a short focal length.

Moreover, a thick multi-layer board can be readily cut by changing the output of laser light or the cutting velocity of the laser according to the thickness of the multi-layer board.

Furthermore, the manufacturing apparatus monitors the kerf width of the multi-layer board and controls the cutting velocity of the laser by feedback, thereby holding the kerf width of the multi-layer board almost constant and narrowing the kerf width of the multi-layer board.

Furthermore, the manufacturing apparatus is provided with a laser optical system having a triple nozzle structure, and a fixing jig 20, and therefore cutting powder is removed effectively. As a result, decreases in yields due to the adhesion of powder to multi-layer boards after cutting can be prevented.

Furthermore, when a cutter or a die is used for cutting, the sharpness of the cutter or the die is reduced because of wear, which may result in irregularities or a crack in the shape of cut surfaces. As a result, defective products are produced. On the other hand, when the multi-layer board is cut by using laser light, defective products are reduced, thereby resulting in improved yields.

Furthermore, laser light is able to cut a plurality of multi-layer boards with shapes of different sizes from one another, and is able to perform two-dimensional cutting, therefore resulting in improved yields.

What is claimed is:

1. A laser processing apparatus comprising:
a stage for mounting a workpiece, which moves said workpiece in the directions of two axes which are in parallel with said workpiece, said two axes being perpendicular to one other;
a laser optical unit placed above said stage, for irradiating said workpiece mounted on said stage with laser light;
a stage controller for controlling the movement of said stage in each direction of said two axes;
said laser optical unit including:
a light source for emitting laser light;
at least one collecting lens for collectin laser light emitted from said light source and irradiating said workpiece with the laser light;
a casing for placing at least said at least one collecting lens on an optical path of the laser light;
a driving unit for moving said casing in a direction parallel to the optical path of the laser light;
wherein said driving unit moves said casing and focuses the focal point of at least said at least one collecting lens on said workpiece;
wherein said laser optical unit further includes:
a second collecting lens for collecting laser light emitted from said light source and irradiating said workpiece, wherein a focal length of said at least one collecting lens is longer than a focal length of said second collecting lens;
wherein said casing houses said at least on collecting lens and said second collecting lens, and either one of said at least one collecting lens and said second collecting lens is placed on the optical path of laser light, and said at least one collecting lens is placed at a longer distance from said workpiece than said second collecting lens, in said casing;
a thickness measuring unit for measuring a thickness of said workpiece; and
a setting unit for placing each of said at least one collecting lens and said second collecting lens on the optical path of laser light, in said casing;
wherein said setting unit places either one of said at least one collecting lens and said second collecting lens on the optical path of laser light in accordance with the measured thickness of said workpiece.

2. A laser processing apparatus according to claim 1, further comprising:
a width measuring unit for measuring a width of a cut portion in said workpiece which is created by the laser light;
wherein said stage controller controls a velocity at which said stage moves in accordance with the width measured by said width measuring unit.

3. A laser processing apparatus according to claim 2, wherein said width measuring unit includes:
a camera for picking up an image of the cut portion in said workpiece which is created by the laser light; and
an image processing unit for measuring a width of the picked up image of the cut portion.

4. A laser processing apparatus according to claim 1, wherein said workpiece is held by a holding unit and is mounted on said stage, said holding unit being provided with a space therein which is substantially sealed when said holding unit holds said workpiece, and said holding unit includes an absorbing unit for absorbing cutting powder to outside of said holding unit, said cutting powder being produced when said workpiece is cut and enters into said space through a cut portion of said workpiece.

5. A laser processing apparatus according to claim 1, wherein said casing further includes:
a first nozzle having said at least one collecting lens placed therein, said first nozzle having at least one first gas leading unit for introducing gas from outside, for letting laser light collected by said at least one collecting lens pass to said workpiece, and for blowing out the gas introduced from said at least one first gas leading unit onto said workpiece;
a second nozzle placed out of said first nozzle, and placed apart from said first nozzle, said second nozzle having at least on absorbing unit connected to the outside for absorbing the gas via a space between said first nozzle and said second nozzle by being sucked from the outside via at least said one absorbing unit;
a third nozzle placed out of said second nozzle, and apart from said second nozzle, said third nozzle having at least one second gas leading unit for introducing gas from the outside, and for blowing out the gas introduced from said at least one second gas leading unit via a space between said second nozzle and said third nozzle onto said workpiece;
wherein at least part of cutting powder produced when said workpiece is cut is blown away from said workpiece by the gas injected from said first nozzle and said third nozzle, and is absorbed by said second nozzle.

6. A $CO_2$ laser processing apparatus for processing a workpiece by $CO_2$ laser light, comprising:
a stage for mounting a workpiece:
a laser optical unit laced above said stage for irradiating said workpiece mounted on said stage with $CO_2$ laser light;
said laser optical unit including:
a light source for emitting $CO_2$ laser light;
at least one collecting lens for collecting $CO_2$ laser light emitted from said light source and irradiating said workpiece with the laser light;
a casing for placing said at least one collecting lens on an optical path of the $CO_2$ laser light;
a controller for controlling an irradiating position of $CO_2$ laser light on said workpiece;
wherein said controller moves said irradiating position of $CO_2$ laser light along each of two axes which are in parallel with said workpiece said two axes being perpendicular to one other and said controller further moves a focal pint of said at least one collecting lens along a direction parallel to the optical path of the $CO_2$ laser light, for positioning on said workpiece;
wherein said laser optical unit further includes:
a second collecting lens for collecting $CO_2$ laser light emitted from said light source and irradiating said workpiece;
wherein a focal length of said at least one collecting lens is longer than a focal length of said second collecting lens;
wherein said casing houses said at least one collecting lens and said second collecting lens, and either one of said at least one collecting lens and said second collecting lens is placed on the optical path of $CO_2$ laser light, and said at least one collecting lens is placed at a longer distance from said workpiece than said second collecting lens, in said casing;

a thickness measuring unit for measuring a thickness of said workpiece; and a setting unit for placing each of said at least one collecting lens and said second collecting lens on the optical path of laser light, in said casing;

wherein said setting unit places either on of said at least one collecting lens and said second collecting lens on the optical path of $CO_2$ laser light in accordance with the measured thickness of said workpiece.

7. A $CO_2$ laser processing apparatus according to claim 6, further comprising:

a width measuring unit for measuring a width of a cut portion in said workpiece which is created by said $CO_2$ laser light;

wherein said controller controls a velocity of said irradiating position of said $CO_2$ laser light at which said stage moves, so that the width measured by said width measuring unit is made constant.

8. A $CO_2$ laser processing apparatus according to claim 7, wherein said width measuring unit includes:

a camera for picking up an image of the cut portion in said workpiece which is created by said $CO_2$ laser light; and an image processing unit for measuring a width of the picked up image of the cut portion.

9. A $CO_2$ laser processing apparatus according to claim 6, wherein said workpiece is held by a holding unit and is mounted on said stage, said holding unit being provided with a space therein which is substantially sealed when said holding unit holds said workplace, and said holding unit includes an absorbing unit for absorbing cutting powder to outside of said holding unit, said cutting powder being produced when said workpiece is cut and enters into said space through a cut portion of said workpiece.

10. A $CO_2$ laser processing apparatus according to claim 6, wherein said casing further includes:

a first nozzle having said at least one collecting lens placed therein, said first nozzle having at least one first gas leading unit for introducing gas from outside, for letting $CO_2$ laser light collected by said collecting lens pass to said workpiece, and for blowing out the gas introduced from said at least one first gas leading unit onto said workpiece;

a second nozzle placed out of said first nozzle, and placed apart from said first nozzle, said second nozzle having at least on absorbing unit connected to the outside for absorbing the gas via a space between said first nozzle and said second nozzle by being sucked from the outside via said a least one absorbing unit;

a third nozzle placed out of said second nozzle, and apart from said second nozzle, said third nozzle having at least one second gas leading unit for introducing gas in from the outside, and for blowing out the gas introduced from said at least one second gas leading unit via a space between said second nozzle and said third nozzle onto said workpiece;

wherein at least part of cutting powder produced when said workpiece is cut is blown away from said workpiece by the gas injected from said first nozzle and said third nozzle, and is absorbed by said second nozzle.

11. A $CO_2$ laser processing apparatus according to claim 6, wherein said $CO_2$ laser processing apparatus processes ceramics as said workpiece.

12. A $CO_2$ laser processing apparatus according to claim 6, wherein said $CO_2$ laser processing apparatus cuts a laminated board which laminates a plurality of green sheets, as said workpiece.

13. A laser processing apparatus, comprising a stage for mounting a workpiece, which moves said workpiece in the directions of two axes which are in parallel with said workpiece, said two axes being perpendicular to one other;

a laser optical unit placed above said stage, for irradiating said workpiece mounted on said stage with laser light;

a stage controller for controlling the movement of said stage in each direction of said two axes;

said laser optical unit including;

a light source for emitting laser light;

a first collecting lens for collecting laser light emitted from said light source and irradiating said workpiece;

a second collecting lens for collecting laser light emitted from said light source and irradiating said workpiece, a focal length of said first collecting lens being longer than a focal length of said second collecting lens;

a casing housing said first collecting lens and said second collecting lens, either one of said first collecting lens and said second collecting lens being placed on the optical path of laser light, and said first collecting lens being placed at a distance from said workpiece longer than that of said second collecting lens, in said casing;

a thickness measuring unit for measuring a thickness of said workpiece;

a setting unit for placing each of said first collecting lens and said second collecting lens on an optical path of laser light, in said casing;

wherein said setting unit places either one said first collecting lens and said second collecting lens on the optical path of laser light, in accordance with the measured thickness of said workpiece; and a driving unit for moving said casing in the direction parallel to said optical path of the laser light;

wherein said driving unit moves said casing, and focuses the focal point of either one of said first collecting lens and said second collecting lens, on said workpiece.

14. A $CO_2$ laser processing apparatus for processing a workpiece by $CO_2$ laser light, comprising:

a stage for mounting a workpiece;

a laser optical unit placed above said stage, for irradiating said workpiece mounted on said stage, with $CO_2$ laser light;

said laser optical unit including:

a light source for emitting $CO_2$ laser light;

a first collecting lens for collecting $CO_2$ laser light emitted from said light source and irradiating said workpiece with the laser light;

a second collecting lens for collecting $CO_2$ laser light emitted from said light source and irradiating said workpiece, a focal length of said first collecting lens being longer than a focal length of said second collecting lens;

a casing housing said first collecting lens and said second collecting lens, either one of said first collecting lens and said second collecting lens being placed on an optical path of $CO_2$ laser light, and said first collecting lens being placed at a distance from said workpiece longer than that of said second collecting lens, in said casing;

a thickness measuring unit for measuring a thickness of said workpiece;

a setting unit for placing each of said first collecting lens and said second collecting lens on the optical path of $CO_2$ laser light, in said casing;

wherein said setting unit places either one of said first collecting lens and said second collecting lens on the optical path of $CO_2$ laser light, in accordance with the measured thickness of said workpiece; and a controller for controlling an irradiating position of $CO_2$ laser light on said workpiece;

wherein, said controller moves said irradiating position of $CO_2$ laser light along each of two axes which are in parallel with said workpiece, said two axes being perpendicular to one other, and further, moves said focal point of said first or second collecting lens along the direction parallel to said optical path of the $CO_2$ laser light, positioning said focal point on said workpiece.

15. An apparatus for processing a workpiece by laser light, comprising:

a stage for mounting a workpiece;

a controller for moving said stage in the directions of two axes which are in parallel with said workpiece, said two axes being perpendicular to one other;

at least two collecting lenses for collecting laser light and irradiating said workpiece, focal lengths of said at least two collecting lenses being different from one another;

a thickness measuring means for measuring a thickness of said workpiece;

means for setting a selected collecting lens of said at least two collecting lenses on an optical path of laser light, said selected collecting lens being selected in accordance with the measured thickness of said workpiece;

means for moving the selected collecting lens so that the focal point of said selected collecting lens is placed at a position 0.1–0.2 mm from a surface of said workpiece;

a light source for emitting laser light;

wherein, the emitted laser light is collected by said selected collecting lens placed by said moving means, and is irradiated on said workpiece.

16. An apparatus for processing a workpiece by laser light, comprising:

a stage for mounting a workpiece;

a light source for emitting laser light;

at least two collecting lenses for collecting the emitted laser light and irradiating said workpiece, focal lengths of said a least two collecting lenses being different from one another;

a thickness measuring means for measuring a thickness of said workpiece;

means for selecting a collecting lens of said at least two collecting lenses in accordance with the measured thickness of said workpiece;

means for positioning said selected collecting lens so that said selected collecting lens is placed at a position distant from surface of said workpiece, longer than the focal length of said selected collecting lens;

a controller for controlling an irradiating position of laser light on said workpiece;

wherein, said controller moves said irradiating position of the laser light along each of two axes which are in parallel with said workpiece, said two axes being perpendicular to one another.

17. A processing method for processing a workpiece by laser light, comprising the steps of:

positioning a workpiece;

measuring a thickness of the workpiece;

selecting a collecting lens of a plurality of collecting lenses having focal lengths which are different from one another, in accordance with the measured thickness of the workpiece;

positioning the selected collecting lenses that a focal point of said selected collecting lens is placed at a position 0.1–0.2 mm apart from a surface of the workpiece;

collecting laser light by the selected collecting lens, and irradiating said workpiece, by the collected laser light; and processing said workpiece by moving the irradiating position of the laser light along each of two axes which are in parallel with the workpiece, the two axes being perpendicular to one another.

18. A processing method for processing a workpiece by laser light, comprising the steps of:

positioning a workpiece;

measuring a thickness of the workpiece;

selecting a collecting lens of a plurality of collecting lenses having focal lengths are different from one another, in accordance with the measured thickness of said workpiece;

positioning the selected collecting lens so that the distance between the selected collecting lens and a surface of the workpiece is longer than the focal length of the chosen collecting lens;

collecting laser light by the selected collecting lens; and irradiating the workpiece, by the collected laser light;

moving the irradiating position of the laser light along each of two axes which are in parallel with the workpiece, the two axes being perpendicular to one another.

* * * * *